US006829262B1

(12) United States Patent
Ackerman et al.

(10) Patent No.: US 6,829,262 B1
(45) Date of Patent: Dec. 7, 2004

(54) AGING IN TUNABLE SEMICONDUCTOR LASERS

(75) Inventors: David Alan Ackerman, Hopewell, NJ (US); Sung-Nee George Chu, Murray Hill, NJ (US); Eric J Dean, Allentown, PA (US); John Evan Johnson, New Providence, NJ (US); Leonard Jan-Peter Ketelsen, Clinton, NJ (US); Liming Zhang, Marlboro, NJ (US)

(73) Assignee: Tri Quint Technology Holding Co., Hillsboro, OR (US)

( * ) Notice: Subject to any disclaimer, the term of this patent is extended or adjusted under 35 U.S.C. 154(b) by 440 days.

(21) Appl. No.: 09/668,675

(22) Filed: Sep. 22, 2000

(51) Int. Cl.[7] .................................................. H01S 3/13
(52) U.S. Cl. .............................. 372/32; 372/43; 372/96; 372/102; 372/98; 372/29.015
(58) Field of Search ........................... 372/20, 102, 82, 372/98

(56) References Cited

U.S. PATENT DOCUMENTS

| | | | | |
|---|---|---|---|---|
| 4,719,636 A | * | 1/1988 | Yamaguchi | 372/50 |
| 5,253,313 A | * | 10/1993 | Kishima | 385/38 |
| 5,253,314 A | | 10/1993 | Alferness et al. | 385/40 |
| 5,288,659 A | * | 2/1994 | Koch et al. | 438/31 |
| 5,506,859 A | | 4/1996 | Ackerman et al. | 372/96 |
| 5,581,572 A | * | 12/1996 | Delorme et al. | 372/50 |
| 5,832,014 A | * | 11/1998 | Johnson | 372/32 |
| 6,021,141 A | * | 2/2000 | Nam et al. | 372/20 |
| 6,504,856 B1 | * | 1/2003 | Broberg et al. | 372/38.07 |

FOREIGN PATENT DOCUMENTS

EP          1195861 A2  *  4/2002     ............. H01S/5/00

OTHER PUBLICATIONS

Joyce, W.B. et al., *AT&T Technical Journal*, "Methodology of Accelerated Aging", vol. 64, No. 3, pp. 717–764, Mar. 1985.

Delorme, F. et al., *IEEE Journal of Selected Topics in Quantum Electronics*, "Long–Term Wavelength Stability of 1.55–$\mu$m Tunable Distributed Bragg Reflector Lasers", vol. 5, No. 3, pp. 480–486, May/Jun. 1999.

* cited by examiner

Primary Examiner—Leon Scott, Jr.

(57) ABSTRACT

A process evaluates an aging property of a distributed Bragg reflector (DBR) laser. The process includes illuminating a Bragg grating of the distributed Bragg reflector (DBR) laser with light while the DBR laser is both supplied a tuning current and not lasing. The process also includes performing an action to the DBR laser responsive to a wavelength of a Bragg peak in a portion of the light reflected by the Bragg grating and a value of the tuning current supplied during the illuminating.

10 Claims, 15 Drawing Sheets

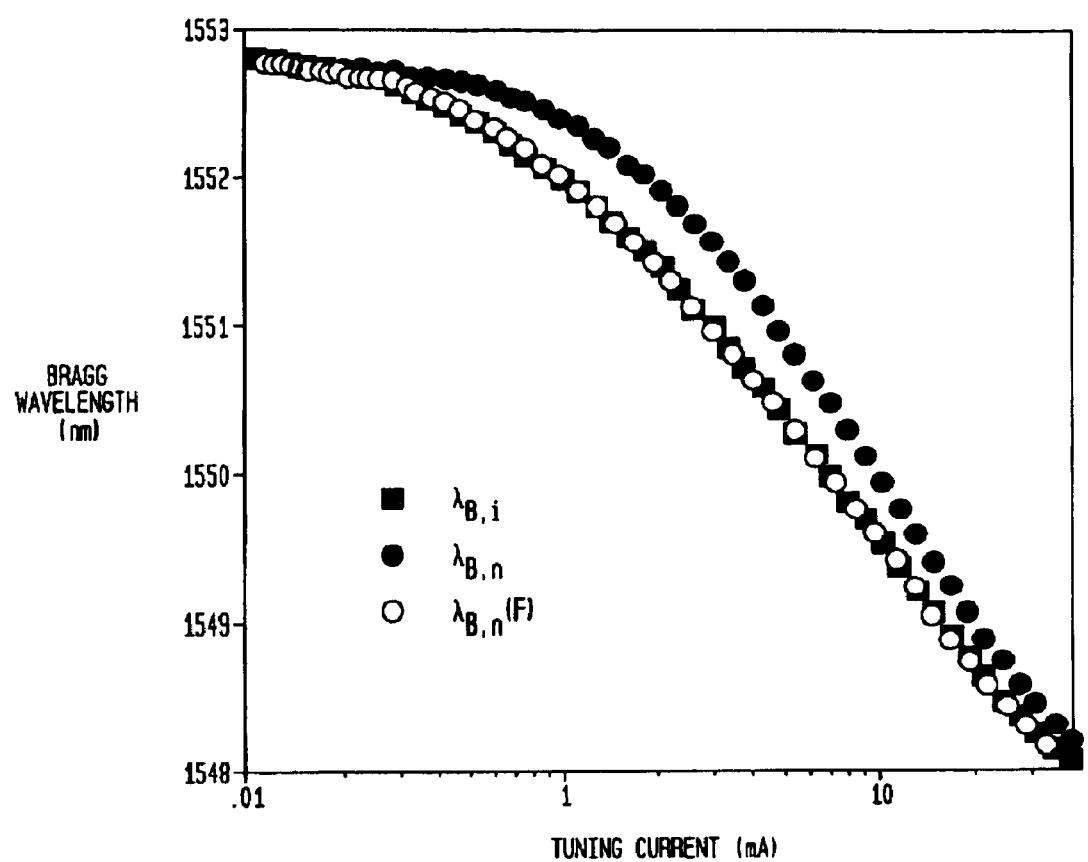

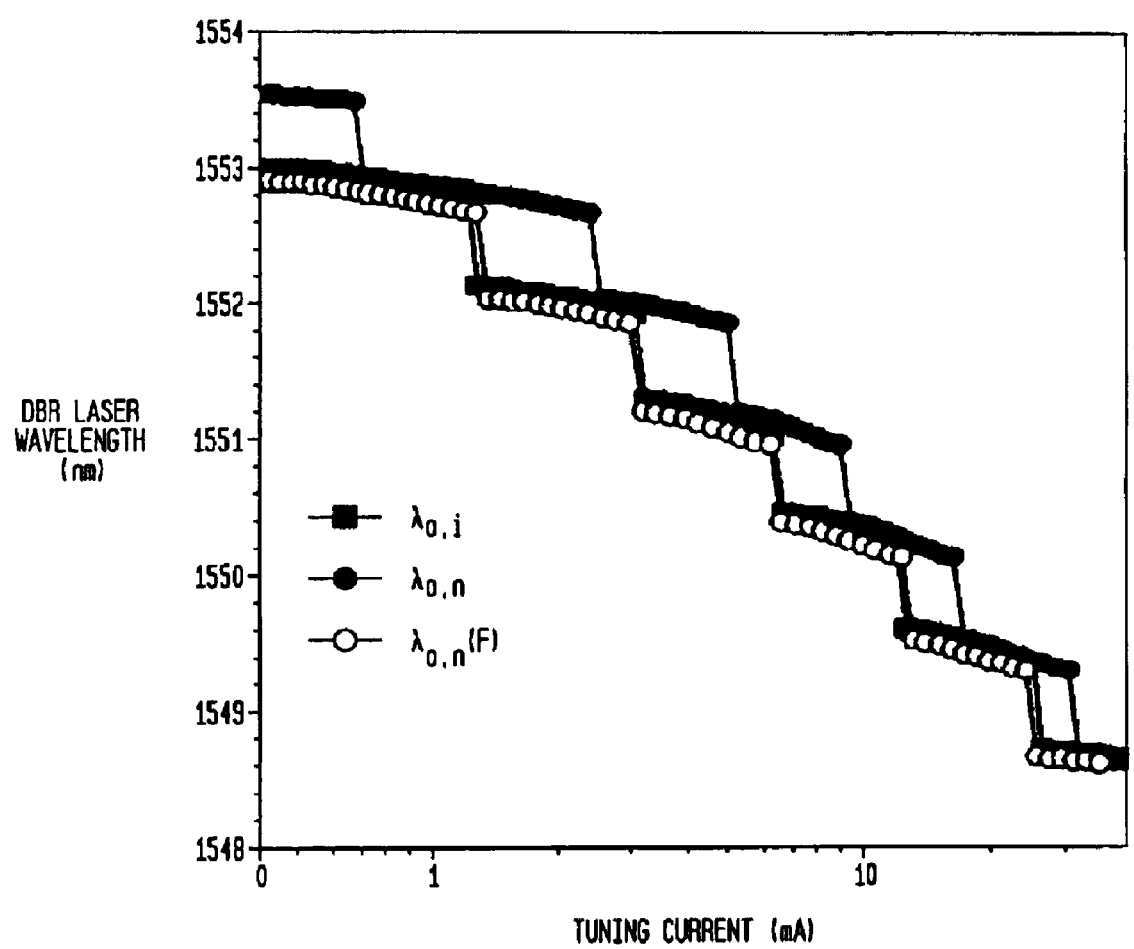

US 6,829,262 B1

AGING IN TUNABLE SEMICONDUCTOR LASERS

BACKGROUND OF THE INVENTION

1. Field of the Invention

This invention relates generally to lasers and, more particularly, to aging of tunable semiconductor lasers.

2. Discussion of the Related Art

Recent work has concentrated on producing laser transmitters for use in dense wavelength division multiplexed (DWDM) optical networks. In a DWDM network, data signals are transmitted in a set of adjacent and spectrally narrow bands. Each band functions as a separate communications channel. For such a channel structure, a transmitter must produce a spectrally narrow output that injects optical energy into a single band. Distributed Bragg reflector (DBR) lasers are strong candidates as transmitters for DWDM networks, because DBR lasers have spectrally narrow outputs.

A tunable DBR laser has an output wavelength that depends on the value of a tuning current. The dependence may be shown by an operating characteristic. FIG. 1 shows an initial operating characteristic 10 for one DBR laser. The operating characteristic 10 has a series of steps 11–20. A DBR laser operates in a single mode by staying on one of the steps when functioning as a DWDM transmitter. The output wavelength remains fairly constant while the laser remains on one step. Use physically changes the DBR laser, and the physical changes alter the locations of the steps 11–20 to produce new operating characteristic 22. On the new characteristic 22, an initial value of the tuning current may produce a new output wavelength. Thus, aging can induce drift of the laser's output wavelength.

Age-induced wavelength drift has serious consequences for DBR lasers that operate as transmitters in DWDM networks. Wavelength drift can cause the laser to hop to a new mode on an operating characteristic. The new mode may have a wavelength that corresponds to a different channel of the DWDM network. Mode hopping can be avoided through closed-loop wavelength feedback, which adjusts the value of the tuning current in response to detecting the onset of a mode hop. Additional closed-loop wavelength feedback can also keep side-band emission levels low, by maintaining operation of the DBR laser near a center of a step. Nevertheless, closed-loop wavelength feedback cannot compensate for changes in the values of tuning currents of other modes, i.e., steps at which the DBR laser is not presently operating. Changes to the value of tuning currents for those modes result in uncertainties on how to change the tuning current to move to a new step on the operating characteristic, e.g., to change the transmission channel in a DWDM network.

BRIEF SUMMARY OF THE INVENTION

In one embodiment, the invention features a process for evaluating an aging property of a distributed Bragg reflector (DBR) laser. The process includes illuminating a Bragg grating of the distributed Bragg reflector (DBR) laser with light while the DBR laser is both supplied a tuning current and not lasing. The process also includes performing an action to the DBR laser responsive to a wavelength of a Bragg peak in a portion of the light reflected by the Bragg grating and a value of the tuning current supplied during the illuminating.

In another embodiment, the invention features a process for operating a wavelength-tunable DBR laser. The process includes operating the DBR laser at a first output wavelength, measuring a value of a tuning current causing the DBR laser to operate at the first output wavelength, and calculating a new value of the tuning current. The act of calculating is based in part on the measured value of the tuning current. The new value is capable of operating the DBR laser at a second output wavelength.

In another embodiment, the invention features an apparatus including a wavelength-tunable DBR laser and a controller coupled to apply a tuning current to an electrical terminal of the DBR laser. The controller is capable of applying a new value of the tuning current to the terminal to cause the DBR laser to jump to a new operating mode and is configured to determine the new value based in part on a measured pre-jump value of the tuning current.

In another embodiment, the invention features a system capable of determining age-induced changes to an output wavelength of a DBR laser. The system includes the DBR laser, a spectrum analyzer positioned to receive light reflected by a tunable Bragg grating of the laser, and a processor coupled to receive data on a reflection spectra of the Bragg grating from the spectrum analyzer. The processor also receives data values of tuning currents associated with the reflection spectra and is configured to determine a functional relation between Bragg peak wavelengths and the values of the tuning currents from the data.

BRIEF DESCRIPTION OF THE SEVERAL VIEWS OF THE DRAWING

FIG. 8A shows initial, aged, and compensated Bragg peak wavelengths of the tunable Bragg grating used in the DBR laser of FIG. 2;

FIG. 8B shows initial, aged, and compensated operating characteristics of the DBR laser of FIG. 2;

DETAILED DESCRIPTION OF THE INVENTION

1. Tunable DBR Lasers

Figure 1:
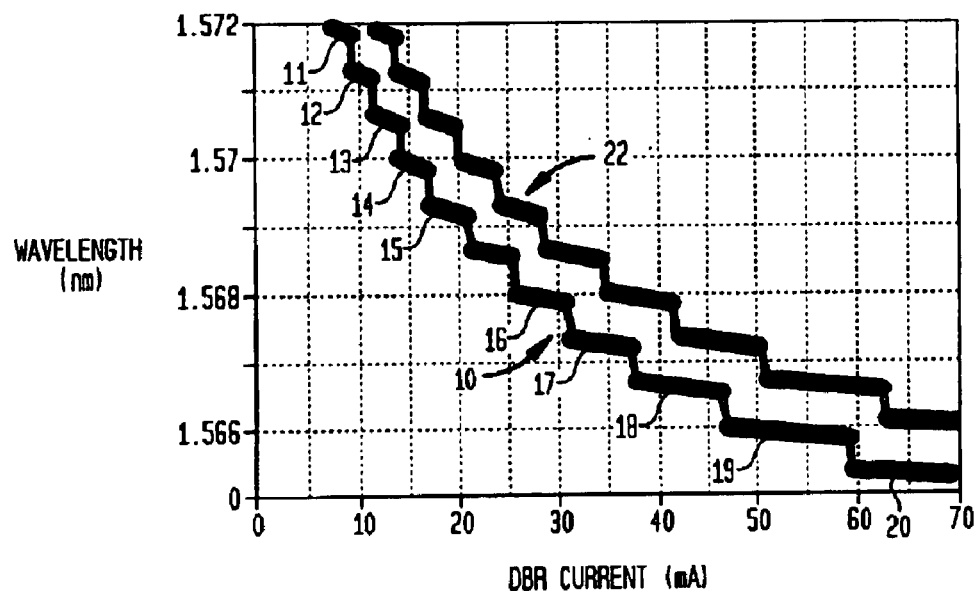
FIG. 1 shows initial and post-aging operating characteristics of a tunable DBR laser.
Figure 2:
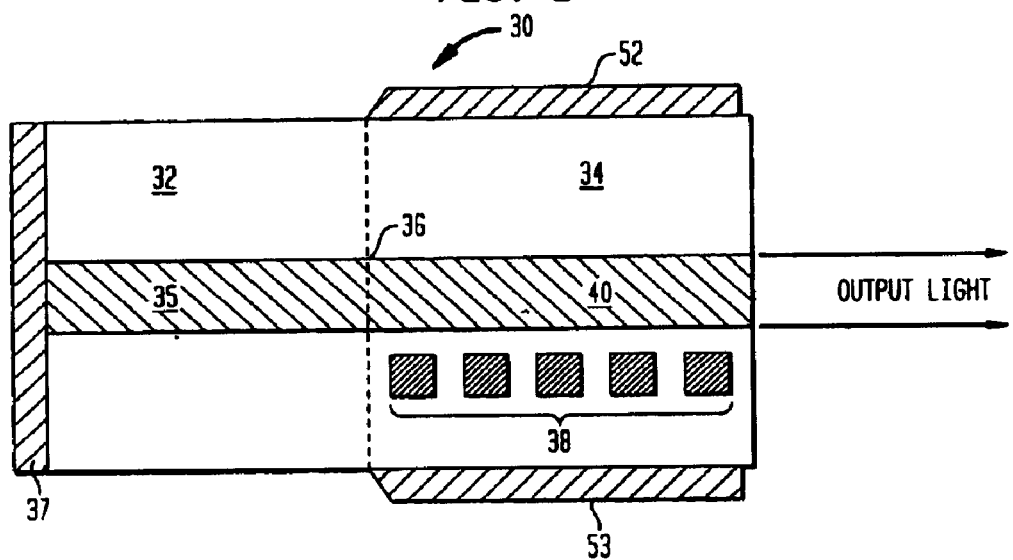
FIG. 2 is a side view of a tunable DBR laser.

Referring to FIG. 2, a tunable DBR laser 30 including at least a gain section 32 and a tuning section 34 is shown. The gain section 32 houses a portion 35 of an optical waveguide 36. The portion 35 has a gain medium and forms a Fabry-Perot cavity in which lasing occurs. The laser's Fabry-Perot cavity is bounded on one side by a reflector 37, e.g., a cleaved crystal facet or a grating, and on a second side by the tuning section 34. The tuning section 34 functions as a tunable reflector for the laser's Fabry-Perot cavity. Aging alters physical properties of the tuning section 34 altering, in turn, the operating characteristics of the DBR laser 30.

The tuning section 34 includes a Bragg grating 38, which is located adjacent to another portion 40 of waveguide 36. The Bragg grating 38 functions as a distributed reflector of the laser's Fabry-Perot cavity by reflecting back a portion of the light received from the cavity. The Bragg grating 38 has a spectrally selective reflectivity that enables tuning of the output wavelength of the DBR laser 30. The spectral selectivity of the Bragg grating provides attenuation for optical side-band modes of the laser's Fabry-Perot cavity so that those modes make up only a smaller portion of the total output optical power of the DBR laser 30. For the DBR laser 30, the output power in the side-band modes can be tuned to be about $10^{-1}$ to $10^{-2}$ percent as compared to even more than 50% for non-DBR lasers whose Fabry-Perot cavities have the same dimensions and gain media.

Figure 3:
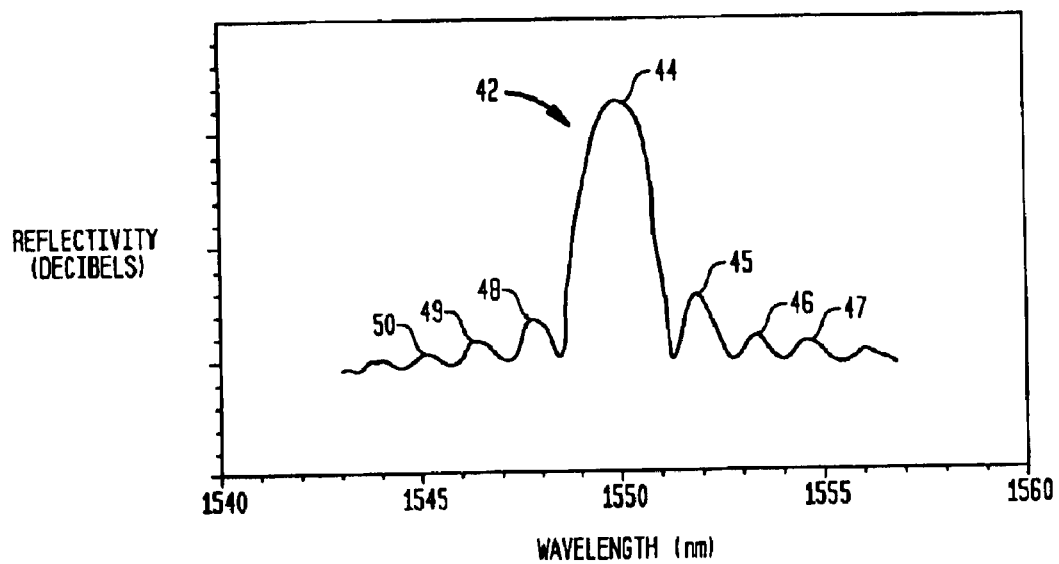
FIG. 3 shows a reflection spectrum of a Bragg grating used in the tunable DBR laser of FIG. 2.

Referring to FIGS. 3 and 2, the reflection spectrum 42 of Bragg grating 38 is shown prior to aging. The reflection spectrum 42 has a strong wavelength-selectivity that is indicated by reflectivity variations between central peak 44 and smaller side peaks 45–50. The wavelength, $\lambda_m$, of the central peak is referred to as the Bragg peak wavelength and is equal to $2L\mu_e(\lambda_m)/m$, i.e., the Bragg peak wavelength is $2L/m$ inside tuning section 34. Here, L is the period of the Bragg grating 38, $\mu_e(\lambda_m)$ is an effective index of refraction in portion 40 of waveguide 36, and m is the grating order, i.e., m is a positive integer. The Bragg grating 38 is a first-order, i.e., m=1.

The central Bragg peak 44 has a full-width at half maximum of about 1 to 3 nanometers (nm) and a reflectivity that is 2–4 or more times as large as the reflectivity of any side peak 45–50. The Bragg peak wavelength is controlled by the value of the tuning current applied to the tuning section 34 via electrical terminals 52, 53. Changing the value of the tuning current changes the effective index of refraction $\mu_e$, in the portion 40 of waveguide 36 in the tuning section 34. Aging produces physical changes to the tuning section 34 that alter the relationship between the value of the tuning current and $\mu_e$.

The output spectrum of the DBR laser 30 depends both on the gain properties of gain section 32 and on the reflectivity of tuning section 34. Optical modes that are either not strongly amplified in the gain section 32 or not strongly reflected by the tuning section 34 are essentially absent in the laser's output optical signal. The gain section 32 has a medium whose gain is almost spectrally flat on the scale of the Bragg reflection width. The spectral flatness of this gain implies that the laser's Fabry-Perot cavity will have several side-band modes and that as much as about 50% of the total output energy could be in those modes if the tuning section 34 also had a spectrally flat reflectivity. In fact, the reflectivity of the tuning section 34 has a strong spectral dependence due to the sharpness of the reflection peaks 44–50 of Bragg grating 38. The spectral dependence of the reflectivity makes the laser's Fabry-Perot cavity function as if it has a strongly spectrally dependent "effective" gain. For such an effective gain, only modes of the Fabry-Perot cavity with wavelengths near that of the central Bragg peak 44 occur in the laser's optical output. For the DBR laser 30, side modes carry about $10^{-1}$ to $10^{-2}$ percent of the output optical energy if a mode of the Fabry-Perot cavity has a wavelength near the Bragg peak wavelength, i.e., optimal operating condition.

Under optimal operating conditions, the Bragg peak wavelength of tunable Bragg grating 38 closely corresponds to the output wavelength of DBR laser 30. This correspondence is used, by various embodiments, to track age-induced changes to the operating characteristic that relates output wavelength to tuning current.

Figure 4:
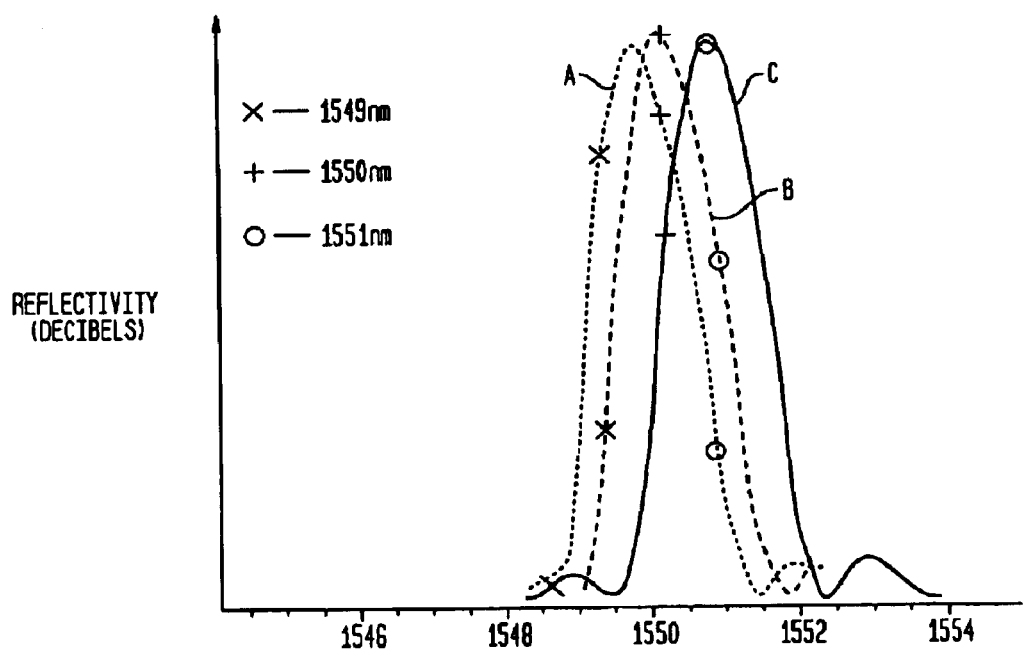
FIG. 4 shows the reflection spectrum of the Bragg grating of FIG. 2 for various values of the tuning current.

Referring to FIG. 4, reflection spectra A, B, and C of Bragg grating 38 for corresponding initial values $I_A$, $I_B$, and $I_C$ of the tuning current are sketched. The initial values of the tuning current satisfy $I_A > I_B > I_C$. The $I_A$, $I_B$, and $I_C$ values of the tuning current produce reflection spectra A, B, and C with different values of Bragg peak wavelength, $\lambda_B$, because the value of effective index of refraction $\mu_e$, depends on the value of the tuning current and the value of Bragg peak wavelength, $\lambda_B$, depends on the value of $\mu_e$.

On each spectrum A, B, and C, the reflectivity of light at 1549, 1550, and 1551 nm, i.e., wavelengths of modes of the laser's Fabry-Perot cavity, are indicated by "x", "+", and "o", respectively. For values of the tuning current producing spectra B and C, one optical mode of the laser's Fabry-Perot cavity has a wavelength closest to the Bragg peak wavelength. That mode has a much higher reflectivity than other modes of the laser's Fabry-Perot cavity, which have wavelengths farther away from the Bragg peak wavelength. For the value of the tuning current producing spectra A, no single mode of the laser's Fabry-Perot cavity has a wavelength close to the Bragg peak wavelength. Here, the two modes of the cavity at 1549 and 1550 nm have comparable reflectivities and are approximately equally well reflected by Bragg grating 38, because both modes have wavelengths at about equal distances from the Bragg peak wavelength.

Figure 5:
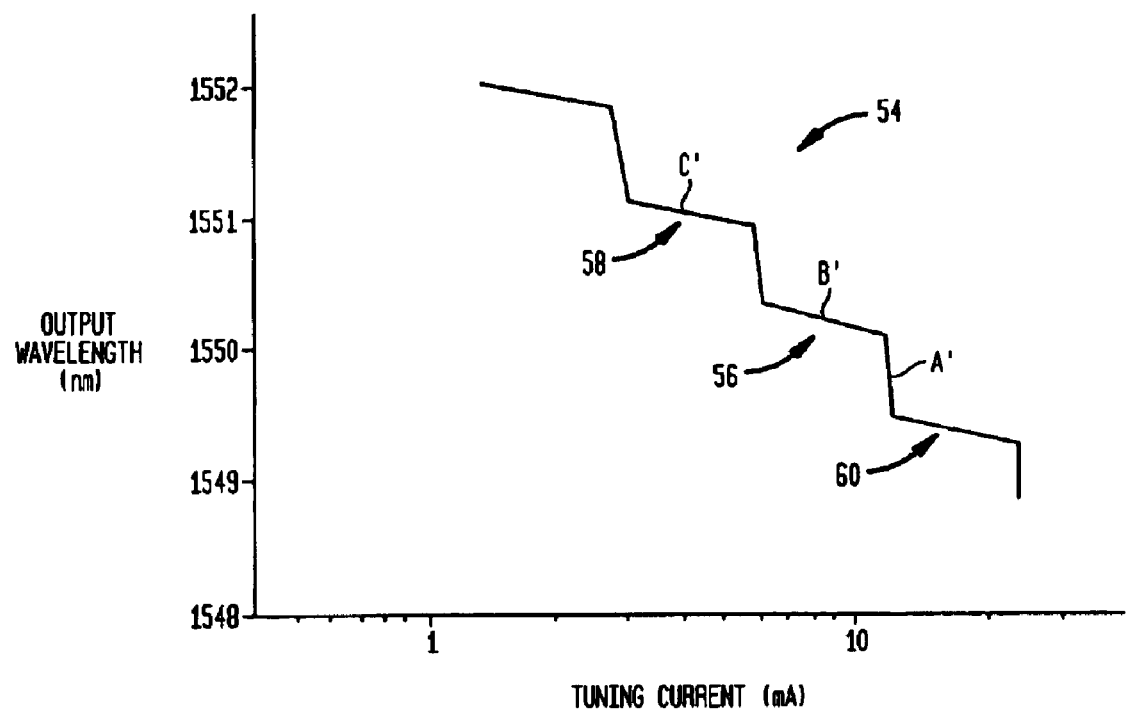
FIG. 5 shows an operating characteristic of the DBR laser at the age at which the Bragg spectra of FIG. 4 were measured.

FIG. 5 shows initial operating characteristic 54 of the DBR laser 30. The operating characteristic 54 indicates how the laser's output wavelength initially depends on the tuning current. On the operating characteristic 54, points A', B', and C' correspond initially to respective values $I_A$, $I_B$, and $I_C$ of the tuning current. Points B' and C' lie at centers of steps 56, 58 of the characteristic 54 and correspond to "pure" operating modes in which side-band emissions are low. Point A' lies on a region between two steps 56 and 60 of the characteristic 54 and corresponds to a mixed mode in which two output wavelengths are present.

Referring to FIGS. 4 and 5, the spectrally selective reflectivity of Bragg grating 38 effectively modulates the gain of the laser's Fabry-Perot cavity. For values $I_B$ and $I_C$ of the tuning current, a single mode of the laser's Fabry-Perot cavity at about 1550 nm and 1551 nm respectively, has a wavelength close to the Bragg peak wavelength of spectra B, C. For these values of the tuning current, only the mode at the Bragg peak wavelength is significantly amplified and capable of lasing. Other modes of the laser's Fabry-Perot cavity are attenuated due to the smaller reflectivity of the Bragg grating 38 at the wavelengths of those modes. These other modes are not significantly present in the output of the DBR laser 30. Thus, the spectra B and C produce "spectrally pure" operating modes at centers of steps 56, 58 of the operating characteristic 54 where side-band emissions are very attenuated. For the value $I_A$ of the current, two modes of the laser's Fabry-Perot cavity at 1549 and 1551 nm are about equally reflected by the Bragg grating 38. Thus, both modes are present in the optical output of the DBR laser 30, and this value of the tuning current corresponds to a point between two steps 56, 60 of the operating characteristic 54.

FIGS. 4 and 5 illustrate that the location of the central reflection peak of tunable Bragg grating 38 with respect to the wavelengths of modes of the laser's Fabry-Perot cavity determines the laser's operation. Operation produces one output wavelength when the wavelength of a single mode of the laser's Fabry-Perot cavity is closest to the Bragg peak wavelength. Operation produces two output wavelengths when two modes of the cavity have wavelengths at roughly equal distances from the Bragg peak wavelength. Since the wavelengths of modes of the laser's Fabry-Perot cavity depend only weakly on the value of the tuning current, measuring shifts to the Bragg peak provides a quantitative measure of age-induced wavelength drift in the DBR laser 30.

2. Compensating for Age-Induced Wavelength Drift

Figure 6:
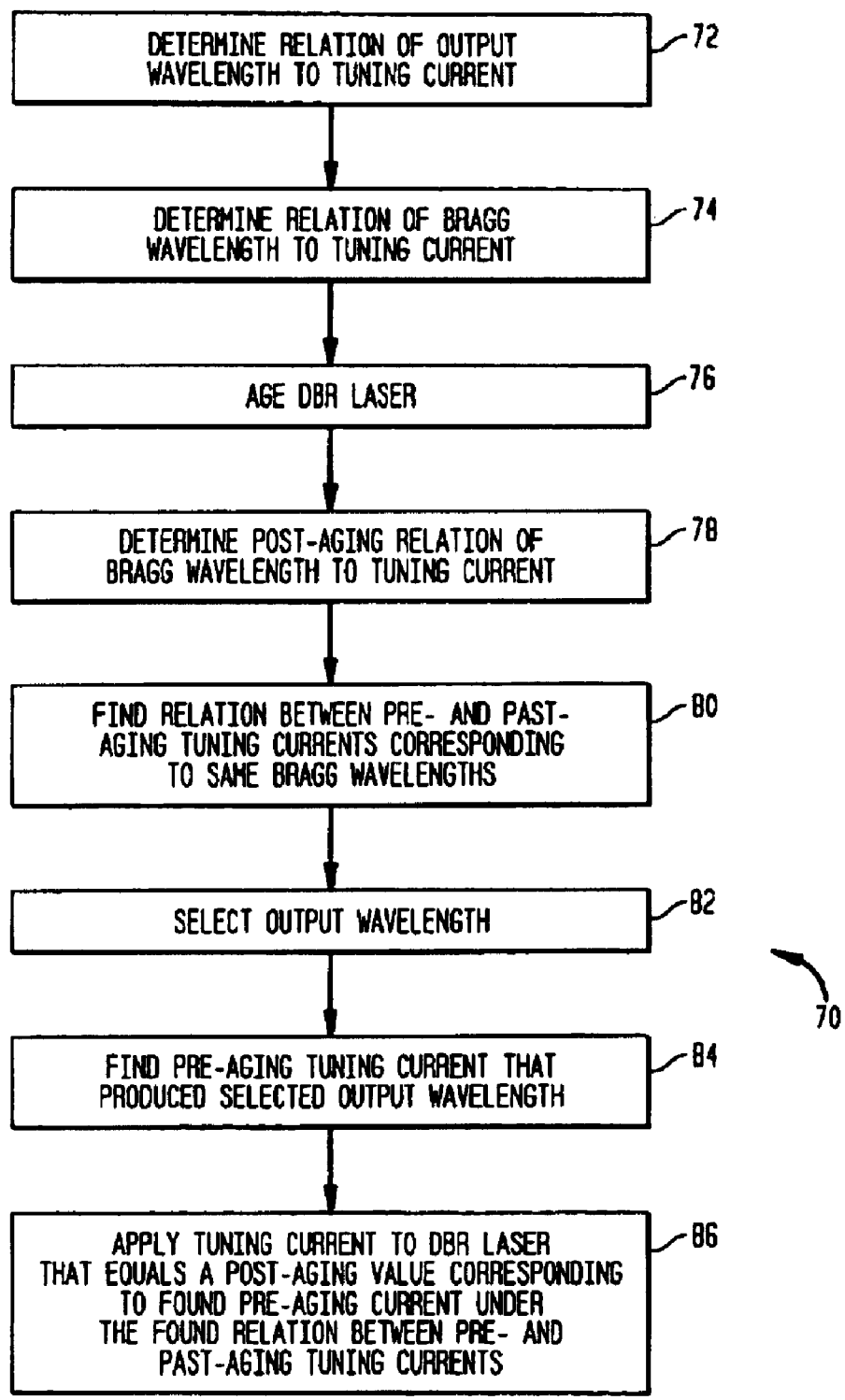
FIG. 6 is a flow chart for a process that compensates for age-induced changes to the operating characteristic of the DBR laser of FIG. 2.

FIG. 6 is a flow chart showing a process 70 that compensates for age-induced wavelength drift in a DBR laser, e.g., laser 30 of FIG. 2. The process 70 determines an initial functional relation, i.e., $\lambda_i(I)$, between the laser's output wavelength, $\lambda_i$, and the value of the tuning current, I (step 72). The relation may provide an operating characteristic such as the characteristic 54 of FIG. 5 or may provide a single pair of corresponding values for an output wavelength and a value of the tuning current that produces that wavelength. The determination of the initial functional relationship is based on measurements of the output spectrum of the DBR laser for one or more initial tuning current values. The process 70 determines a functional relation, $\lambda_{B,i}(I)$, between initial Bragg peak wavelengths, $\lambda_{B,i}$, of the laser's tunable Bragg grating and values of the tuning current, I (step 74). The determination of this initial relation uses spectral measurements on light reflected by the laser's tunable Bragg grating while the laser is not lasing, i.e., gain section 32 is OFF.

Next, process 70 ages the DBR laser either through normal use or through accelerated use (step 76). After aging, the process 70 again determines the functional relation, $\lambda_{B,n}(I)$, between Bragg peak wavelength, $\lambda_{B,n}$, and one or more values of the tuning current, I (step 78). The determination of the post-aging functional relationship includes performing new optical reflectivity measurements on the laser's Bragg grating while the DBR laser is not lasing. Various embodiments assume that the tuning current, I, is either a linear or cubic polynomial in measured Bragg peak wavelength $\lambda_{B,i}$ or $\lambda_{B,n}$ as appropriate.

From the pre-aging and post-aging Bragg spectra, process 70 finds a relation between post-aging values, $I_n$, and pre-aging values, $I_i$, of the tuning current that correspond to the same Bragg peak wavelength (step 80). The corresponding values define a functional relationship such as $I_n=F(I_i)$ or $I_i=F^{-1}(I_n)$. To find the corresponding values, the process 70 solves $\lambda_{B,n}(I_n)=\lambda_{B,i}(I_i)$. An exemplary relationship is $I_n-I_i = f(\lambda_{B,n}(I_i)-(\lambda_{B,i}(I_i)))$, which relates the shift of the post-aging tuning current $I_n$ with respect to the pre-aging current $I_i$ to the age-induced change in Bragg wavelength for the same tuning current $I_i$.

Figure 7:
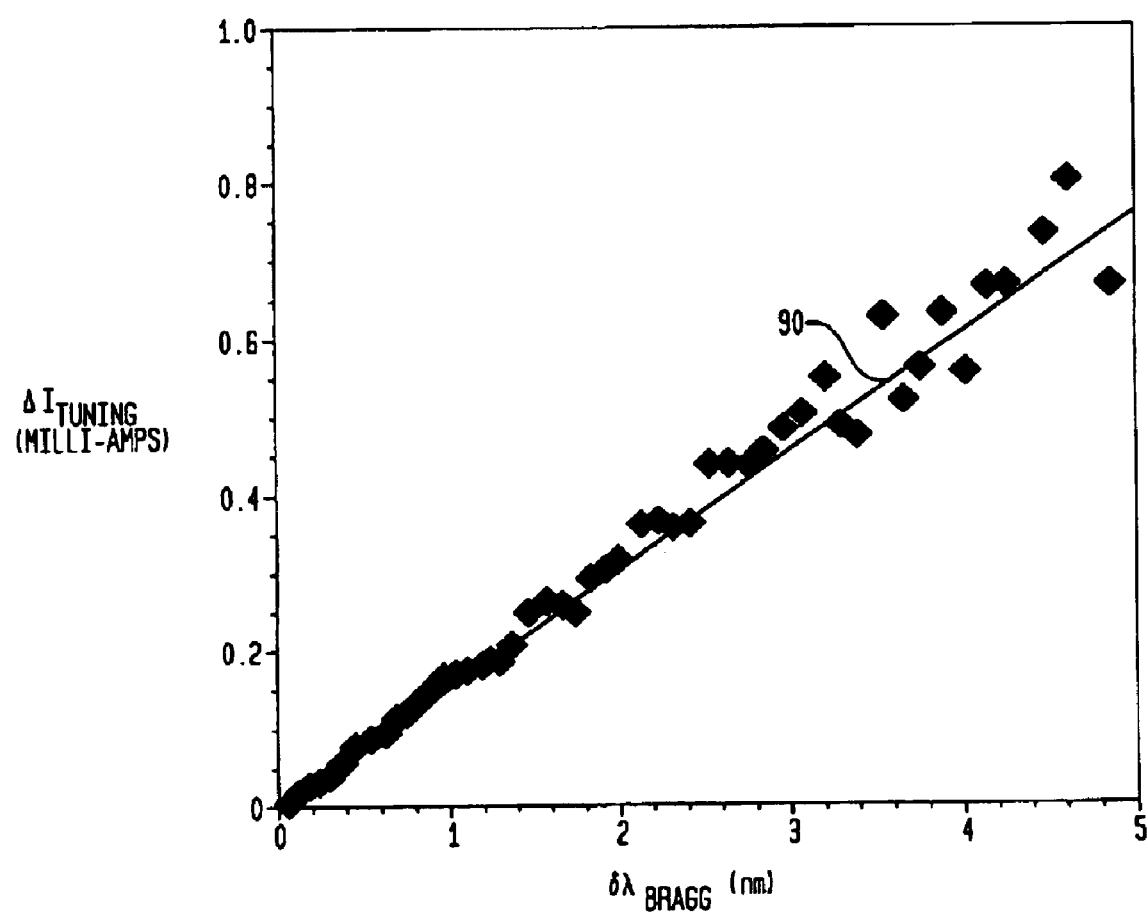
FIG. 7 shows the age-induced change to the relation between Bragg wavelength shift and tuning current for the DBR laser of FIG. 2.

FIG. 7 plots data that illustrate the relationship between age-induced shifts to tuning currents $\Delta I_{tuning}$, i.e., $\Delta I_{tuning} = I_n - I_i$, and $\delta\lambda_B$ for an exemplary DBR laser. Herein, $\delta\lambda_B$ is the post-aging shift of the Bragg peak wavelength $\lambda_B$ from the value for no tuning current, i.e., $\delta\lambda_B(I_n)=\lambda_{B,n}(I_n)-\lambda_{B,n}(0)$. Since $\lambda_{B,n}(0)=\lambda_{B,i}(0)$, $\delta\lambda_B$ tracks changes to the Bragg peak wavelength for tuning current, $I_n$. The data points show that $\Delta I_{tuning}$ depends linearly on $\delta\lambda_B$. The linear dependence is approximately described by line 90 whose slope is "$\Delta a$". In terms of this slope, the relation between post-aging and pre-aging currents $I_n$ and $I_i$ is approximately given by $I_n=I_i+\Delta a[\lambda_{B,n}(I_n)-\lambda_{B,n}(0)]$.

The functional relationship between pre-aging and post-aging values of the tuning current enables compensating for age-induced wavelength drift during operation of the DBR laser. To operate the DBR laser, the process 70 selects an output wavelength (step 82). The process 70 finds the pre-aging tuning current, $I_s$, that previously generated the selected output wavelength by using the pre-aging relationship between output wavelength and tuning current (step 84). Then, the process 70 applies a new value of tuning current, $I_a$, to the DBR laser (step 86). The new value $I_a$ corresponds to the pre-aging tuning current, $I_s$, under the relationship found between pre-aging and post-aging tuning currents, i.e., $I_a=F(I_s)$. Applying the new value, $I_a$, of the tuning current produces the selected output wavelength.

FIGS. 8A and 8B illustrate results obtained from compensation process 70 of FIG. 6 for an exemplary DBR laser. FIG. 8A displays measured pre-aging and post-aging functions $\lambda_{B,i}(I)$ and $\lambda_{B,n}(I)$, respectively, which relate Bragg peak wavelength to tuning current for the exemplary DBR laser. FIG. 8A also displays compensated function, $\lambda_{B,n}(F(I))$ to show the quality of the function F through the agreement between Bragg peak wavelengths $\lambda_{B,n}(F(I))$ and $\lambda_{B,i}(I)$. FIG. 8B displays pre-aging operating characteristic, $\lambda_{o,i}(I)$, and post-aging operating characteristic, $\lambda_{o,n}(I)$ for the same DBR laser. FIG. 8B also displays the compensated post-aging operating characteristic, $\lambda_{o,n}(F(I))$, which the process 70 obtained from the function $F(I_i)$ relating pre-aging and post-aging values of tuning currents. Heights and tuning current ranges of the pre-aging and compensated post-aging operating characteristics $\lambda_{o,i}(I)$ and $\lambda_{o,n}(F(I))$, respectively, agree to within measurement uncertainties.

The close agreement between the curves for $\lambda_{o,n}(F(I))$ and $\lambda_{o,i}(I)$ shows that operating the aged DBR laser at compensated values $F(I_i)$ of the pre-aging tuning current, $I_i$, current eliminates wavelength drift. In particular, if current $I_i$ operated the DBR laser optimally prior to aging, i.e., at a center of a selected step on an operating characteristic, then the current $F(I_i)$, which is provided by process 70, will optimally operate the DBR laser after aging.

3. Measuring Bragg Reflection Spectra

Figure 9:
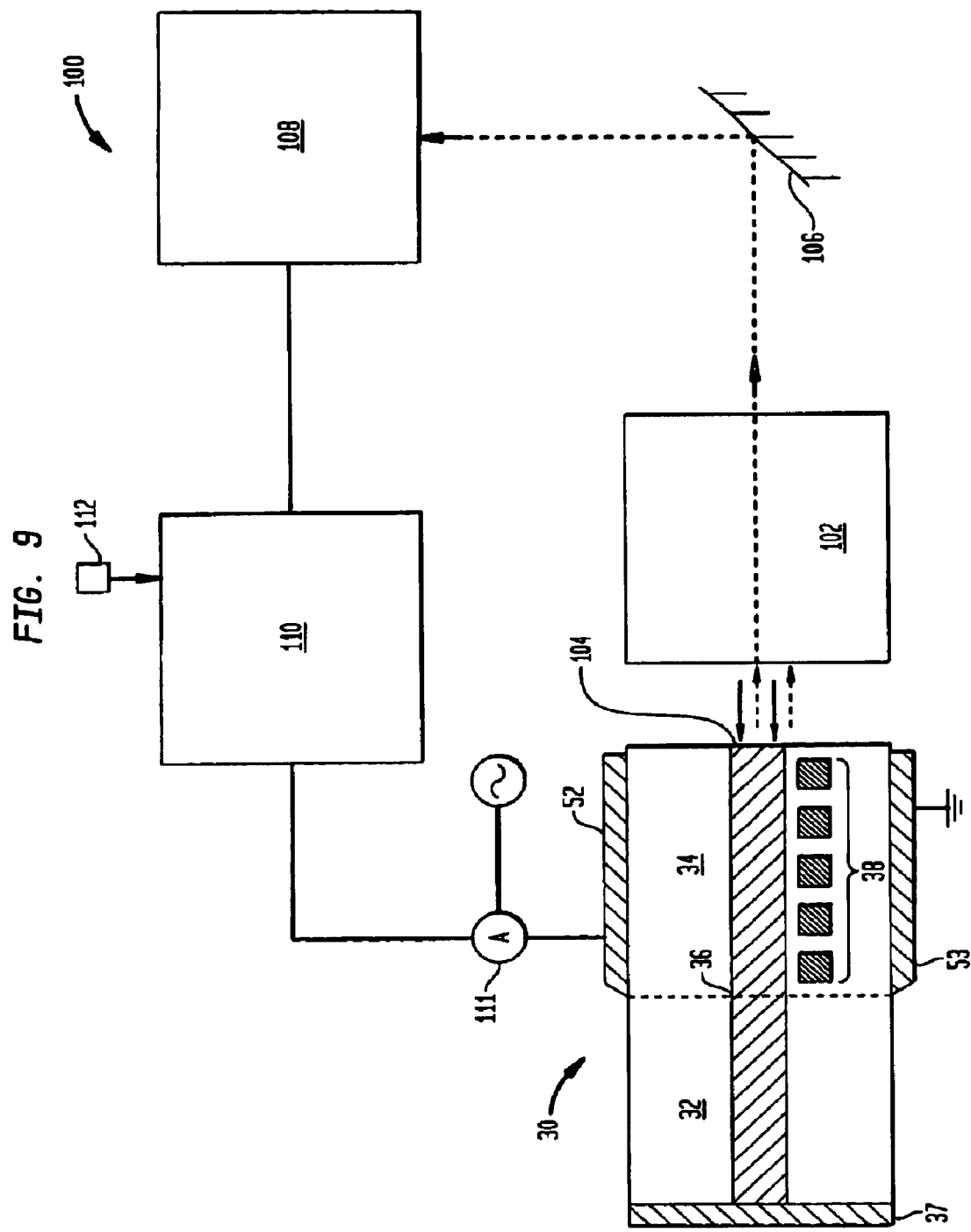
FIG. 9 shows an apparatus for measuring age-induced changes to the operating characteristic of a DBR laser.

FIG. 9 shows an apparatus 100 for measuring Bragg peak wavelengths and tuning currents of DBR laser 30. The apparatus 100 includes an external light source 102 for illuminating Bragg grating 38 through an optical input/output 104 while the DBR laser 30 is supplied a tuning current, e.g., via terminals 52, 53 and is not lasing. The light source 102 produces a spectrum that is broad and featureless over a wavelength band in which the Bragg reflection spectrum of the Bragg grating 38 is located. To inhibit lasing during measurements of the Bragg reflection spectrum, either no current is applied to the gain section 32 of the DBR laser 30 or the current is kept below the current value at which the gain section 32 becomes transparent. Light reflected by the Bragg grating 38 passes back through optical input/output 104 and is reflected by a reflector 106 into a spectrum analyzer 108. The spectrum analyzer 108 provides data on spectral intensities to a processor 110.

The processor 110 performs an action on DBR laser 30 in response to data on the reflection spectra from spectrum analyzer 108 and time-correlated data on tuning currents from ammeter 111. In some embodiments, the action includes applying a tuning current of value $F(I_i)$ to tuning section 34 to compensate for age-induced shifts to a pre-aging tuning current, $I_i$. In other embodiments, the action includes qualifying or disqualifying DBR laser 30 with respect to subsequent age-induced wavelength shifts.

The processor 110 includes program storage media 112, e.g., a random access memory, hard drive, a magnetic disk, or an optical disk, that stores a control program written in a computer-executable form. The program is configured to perform process 70 based on data received from spectrum analyzer 108 and ammeter 111 while Bragg grating 38 is externally illuminated by light source 102. The program uses the data to determine the function, $F(I_i)$, which defines a post-aging tuning current, $I_n$, that compensates age-induced effects on pre-aging tuning current, $I_i$, and thus, to determine the form of the above-described action to be performed on the DBR laser 30.

Figure 10:
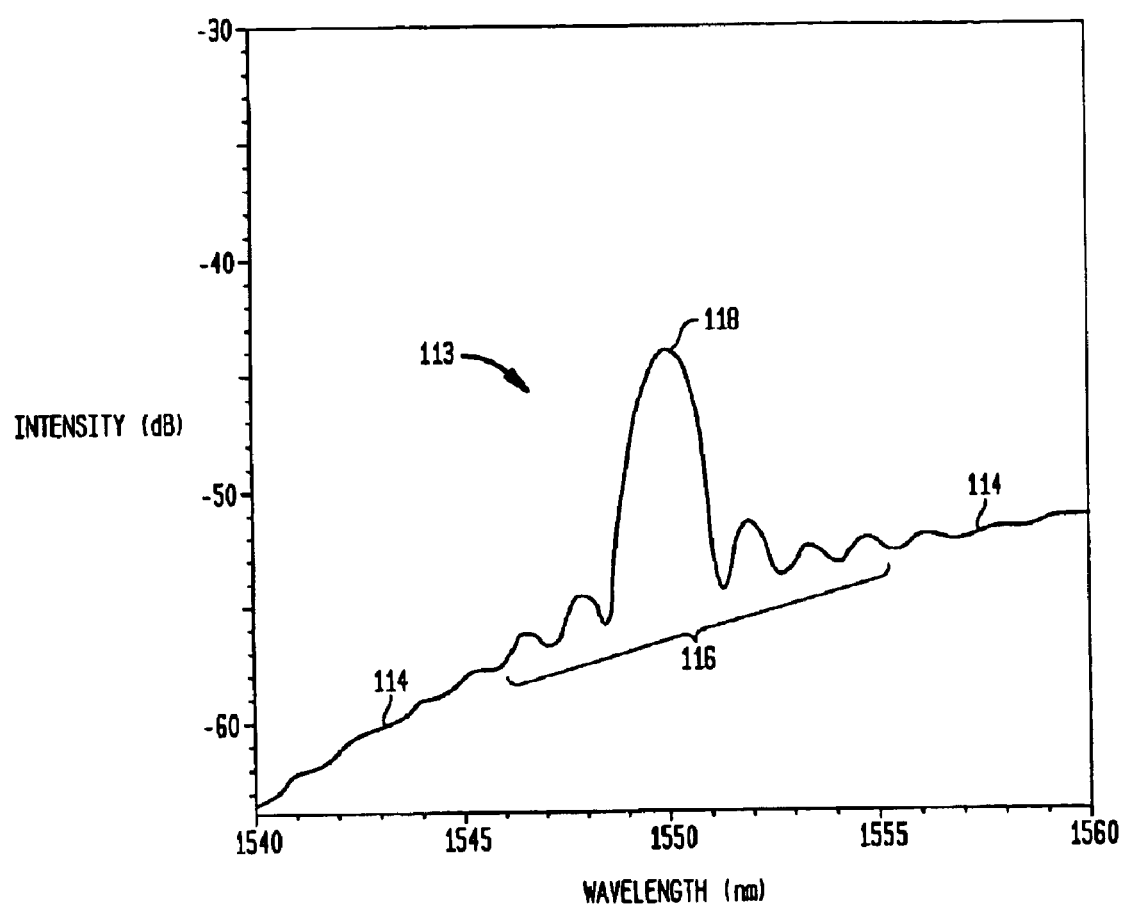
FIG. 10 shows a reflection spectrum measured by the apparatus of FIG. 9.

FIG. 10 shows an exemplary spectrum 113 from the spectrum analyzer 108. The spectrum 113 includes a slowly varying background light 114, which may, e.g., be produced by an absorption edge of a digital electro-absorption modulator (not shown) located along the path of reflected light. Electro-absorption modulators tend to cut off short wavelength light. The background light 114 also includes direct light from light source 112. On top of the background light 114, the light reflected by the Bragg grating 38 forms a system of reflection peaks 116 that includes a central Bragg peak 118. Since the background light 114 is broadband, the processor 110 or analyzer 108 can distinguish the reflection peaks 116 from the background light 114.

Some embodiments use a different geometry in which an external light source illuminates Bragg grating 38. Then, only reflected light is received by the spectrum analyzer 108, because the reflected light does not pass back through light source 102 in those embodiments.

Figure 11:
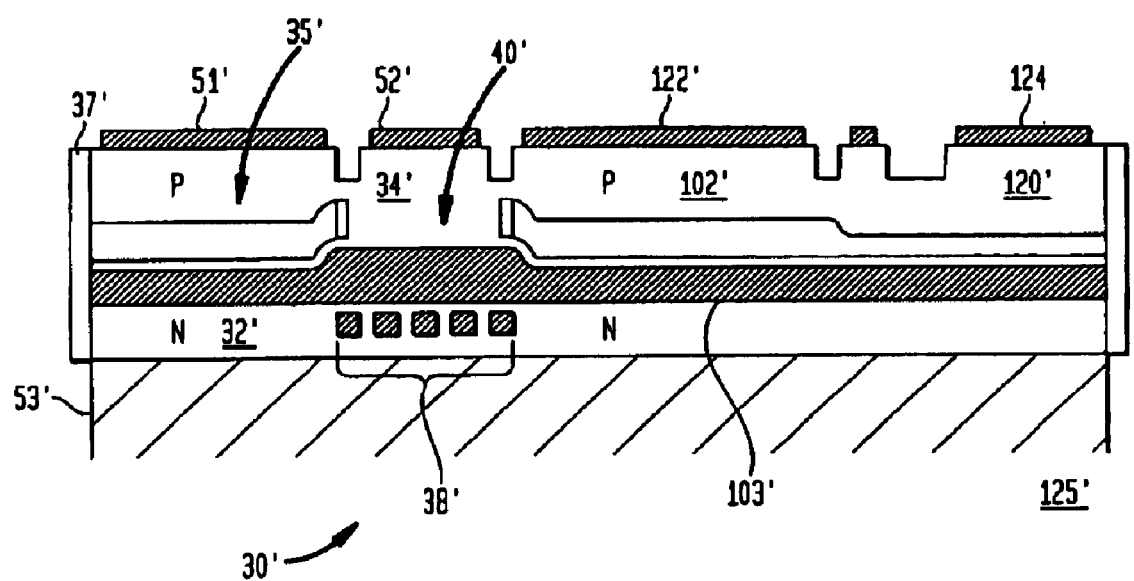
FIG. 11 is a side view of a monolithic tunable DBR laser.

FIG. 11 shows a monolithic tunable DBR laser 30' whose age-induced wavelength drift can be compensated by process 70 of FIG. 6. The DBR laser 30' has collinear gain, tuning, amplification, and digital modulation sections 32', 34', 102', 120' constructed into a single InP semiconductor substrate.

The gain section 32' includes a strongly index-guided waveguide 35' that has two parallel portions. The wave guide 35' belongs to a P-N junction that is located in a heterostructure. The P-N junction provides optical amplification when forward biased and becomes optically opaque when unbiased or reverse-biased, e.g., by shorting electrical terminals 51' and 53'. The strongly index-guided waveguide 35', a cleaved crystal facet 37', and a reflective tuning section 34' form a laser Fabry-Perot cavity.

The waveguide 35' couples to waveguide 40', which is located in tuning section 34' and does not have a pumpable gain medium. The waveguide 40' is adjacent Bragg grating 38'. The Bragg grating 38' is tunable through a tuning current applied via to terminals 52' and 53' as previously described.

The waveguide 40' also couples to waveguide 103' of amplification section 102'. The waveguide 103' is located in another P-N heterostructure that can be pumped by a current applied to terminal 122' to optically amplify light received from tuning section 34'. When electrically pumped, the P-N junction of the amplification section 102' also produces broadband light through spontaneous emission.

The waveguide 103' prolongs into digital modulation section 120', which is controlled through biasing terminal 124'. The modulation section 120' amplitude-modulates continuous wave signals from amplification section 102' to produce digital optical output signals. The modulation section 120' includes an anti-reflective coating 125' that reduces reflections.

An example of the monolithic tunable DBR laser 30' of FIG. 11 is described in U.S. Pat. No. 5,253,314; which is incorporated by reference herein in its entirety.

Figure 12:
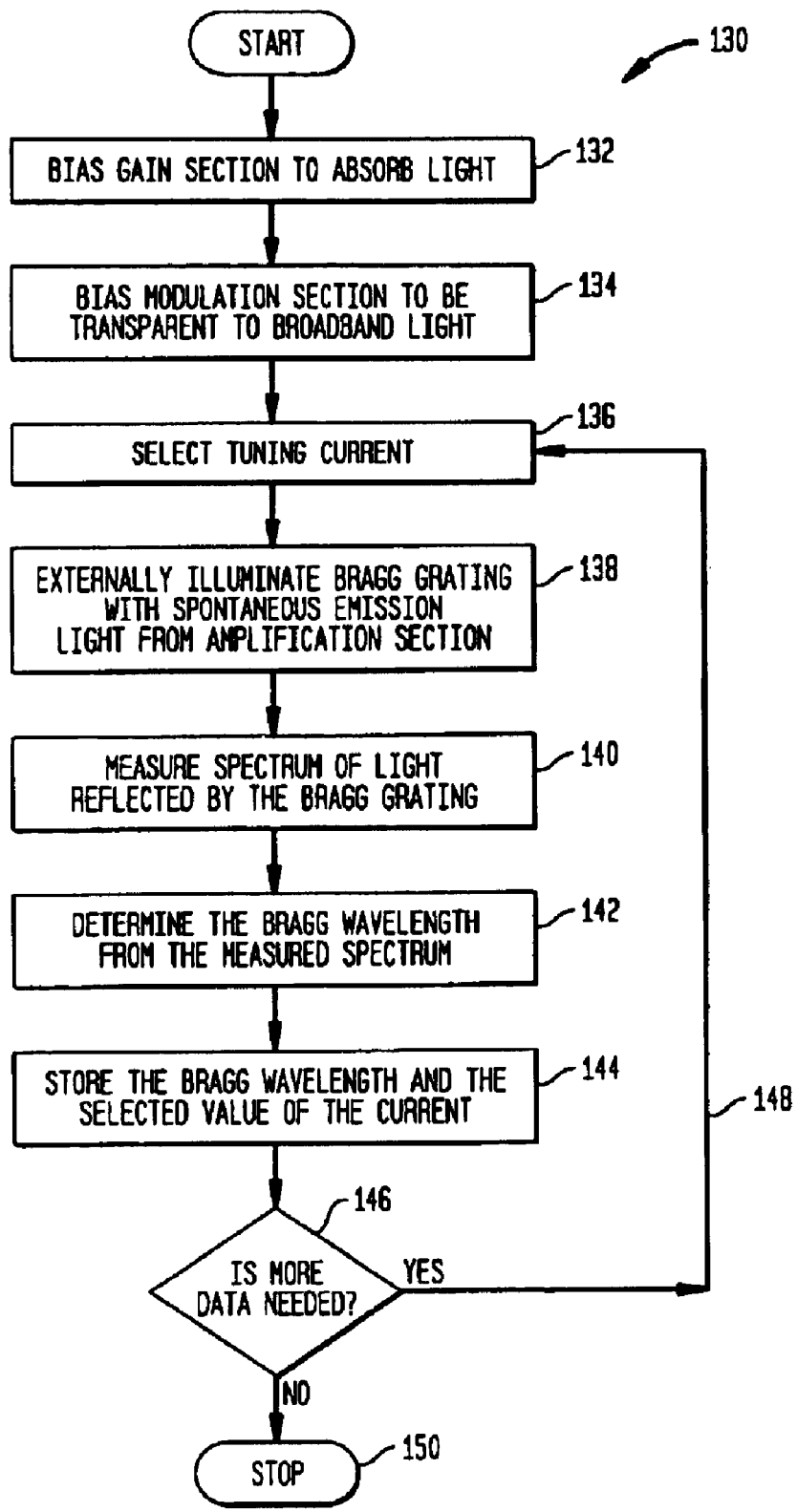
FIG. 12 is a process for measuring Bragg spectra of the DBR laser of FIG. 11 using the apparatus of FIG. 9.

FIG. 12 shows a process 130 for measuring Bragg spectra of tunable DBR laser 30' of FIG. 11. The process 130 electrically biases gain section 32' so that externally incident light is absorbed (step 132). Absorption occurs when the current flowing through electrical terminal 51' has a value below a threshold for optical transparency. In one embodiment, terminals 51' and 53' are shorted so that the gain section 32' is opaque to light incident from tuning section 34'. The process 130 also applies a voltage to terminal 124 to bias digital modulation section 120' to be transparent or semi-transparent so that light reflected by Bragg grating 38' can escape to be detected by an external spectrum analyzer (step 134). The biasing may however, leave the modulation section 120' slightly absorbant to impede optical resonances caused by multiple reflections between reflective coating 125' and the Bragg grating 38'. The process 130 applies a selected tuning current to the tuning section 34' (step 136). The process 130 applies an electrical current either to amplification section 122' or to gain section 32' so that broadband light is spontaneously emitted to illuminate the Bragg grating 38' while the DBR laser 30' is not lasing (step 138). Then, the amplification section 102' or gain section 32' functions as the light source 102 by producing spontaneous emission light due a forward biasing of a P-N junction. Any current in the gain section 32' is smaller than the threshold for self-sustaining "stimulated" emission that causes lasing.

The process 130 measures the spectrum of back reflected light from the Bragg reflector 38' (step 140). From the measured spectrum, the process 130 determines the wavelength of the Bragg reflection peak (step 142). This determination may include subtracting out a broadband background of spontaneous emission light from the tuning section 102'. Then, the process 130 stores the corresponding pairs of values of Bragg peak wavelength and tuning current (step 144). The process 130 determines whether Bragg peak wavelengths corresponding to other values of the tuning current are needed (step 146). If data for other values of the tuning current is needed, the process 130 loops back to repeat the determination for a new value of the tuning current (148). If data corresponding to the needed values of the tuning current has been obtained, the process 130 stops (step 150).

4. Prequalifying Lifetimes of DBR Lasers

Referring to FIG. 11, individual copies of monolithic DBR laser 30' have operating characteristics that differ due to uncontrollable construction variations in dimensions, positions, and physical characteristics of elements of the lasers. To account for variations to tuning section 34', each DBR laser 30' needs to be initially calibrated to determine the laser's operating characteristic. Thereafter, age-induced wavelength drift can be regularly measured and compensated for as described in process 70 of FIG. 6.

Instead of regularly compensating for wavelength drift through process 70, each DBR laser 30' can be initially quality tested to predict a lifetime over which that laser's wavelength-to-tuning-current characteristic is unlikely to vary. At the end of the pre-determined lifetime, the DBR laser 30' can be discarded. The use of quality testing avoids the need to deploy apparatus 100 of FIG. 9 to regularly monitor wavelength drift for individual DBR lasers 30'. The lifetime prediction may be implemented as a simple prequalification/pre-disqualification criteria performed during production, i.e., pass/fail, or as an individualized prediction of a lifetime for each DBR laser 30'.

Figure 13:
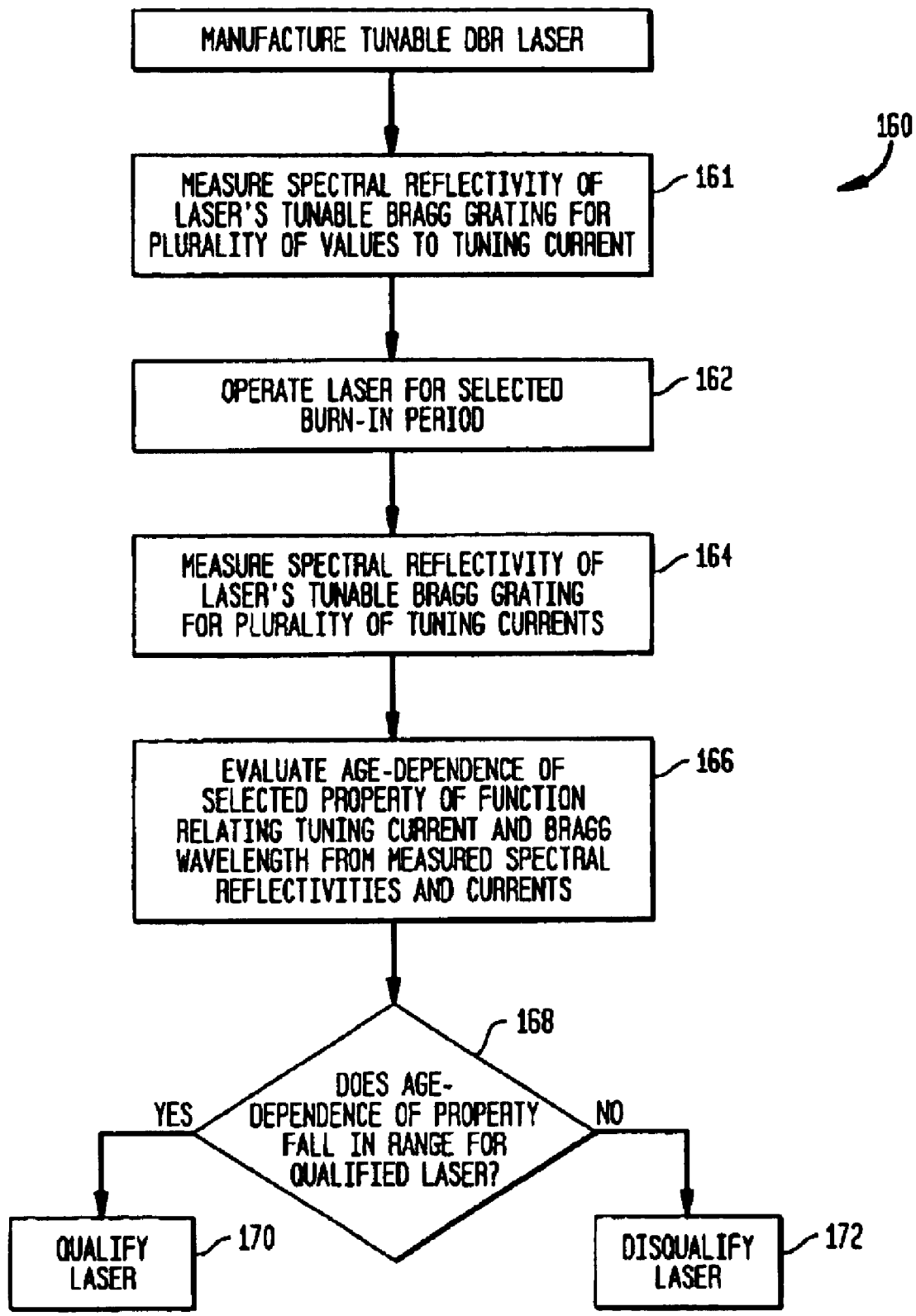
FIG. 13 is a process for qualifying or disqualifying a tunable DBR laser with respect to stability against wavelength drift over a preselected lifetime.

FIG. 13 is a flow chart showing a process 160 for qualifying or disqualifying a tunable DBR laser, e.g., laser 30' of FIG. 11, with respect to stability against future wavelength drift. The process 160 measures the Bragg peak wavelength of the laser's tunable Bragg grating for a plurality of values of the laser's tuning current, e.g., by process 130 of FIG. 12 (step 161). After manufacture of the DBR laser, the process 160 operates the laser during a preselected burn-in period (step 162). The length of the burn-in period may vary for different types of tunable DBR lasers. e.g., 0, 10%, or 20% of the expected lifetime for the laser 30'. After the burn-in, the process 160 again measures Bragg peak wavelengths of the laser's tunable Bragg grating for the plurality of values of the laser's tuning current (step 164). From the pre-aging and post-aging measurements, the process 160 evaluates the age-dependency of a preselected property of the function, $I(\lambda_B)$, which relates Bragg peak wavelength, $\lambda_B$, to the tuning current I (step 166). In one embodiment, the preselected property is the coefficient A for mono-molecular contributions to $I(\lambda_B)$. The mono-molecular contribution is strongly affected by defect densities in the laser's tuning section, and defect densities are increased by aging. The process 160 determines whether the age-dependency of the preselected property falls in a pre-determined range, which qualifies the laser against wavelength drift during the preselected lifetime (step 168). If the age-dependency is in the predetermined range, the process 160 qualifies the DBR laser under test (step 170). If the age-dependency is outside the qualification range, the process disqualifies the DBR laser under test, and the laser is discarded (step 172).

The tuning current, I, is approximately expressible as a cubic polynomial of the carrier density, $n_t$, in the laser's tuning section. Thus, the current, I, is given by:

$$I/e \cdot V = a \cdot n_t + b \cdot n_t^2 + c \cdot n_t^3$$

where "a", "b", and "c" are measurable constants. The "a" term is the mono-molecular contribution, which is most sensitive to physical changes induced by aging. To relate the value of the tuning current to Bragg peak wavelength, one writes the change $\delta\lambda_B$ in the Bragg peak wavelength as a linear function of the change, $\delta n_t$, in the carrier density.

$$\delta\lambda_B = \frac{\lambda_B}{n_e}\Gamma\frac{dn_i}{dn_t}\delta n_t.$$

Here, $n_i$, $n_e$, and $\Gamma$ are the refractive index, the effective index of refraction, and the confinement factor for waveguide 40'. Combining both equations produces a relation between shifts to the Bragg peak wavelength, $\delta\lambda_B$, caused by nonzero tuning currents, I, and values of the tuning current, I. The relation is given by:

$$a = a'\frac{\lambda_B\Gamma}{eVn_e}\frac{dn_i}{dn_t},\ b = b'\frac{\lambda_B\Gamma}{eVn_e}\frac{dn_i}{dn_t},\ \text{and } c = c'\frac{\lambda_B\Gamma}{eVn_e}\frac{dn_i}{dn_t}.$$

Here, $\delta\lambda_B$ is equal to $\lambda_B(I) - \lambda_B(0)$. In this equation, the values of coefficients "a", "b", and "c" are obtained from measured values of the Bragg peak wavelength and tuning current.

Figure 14:
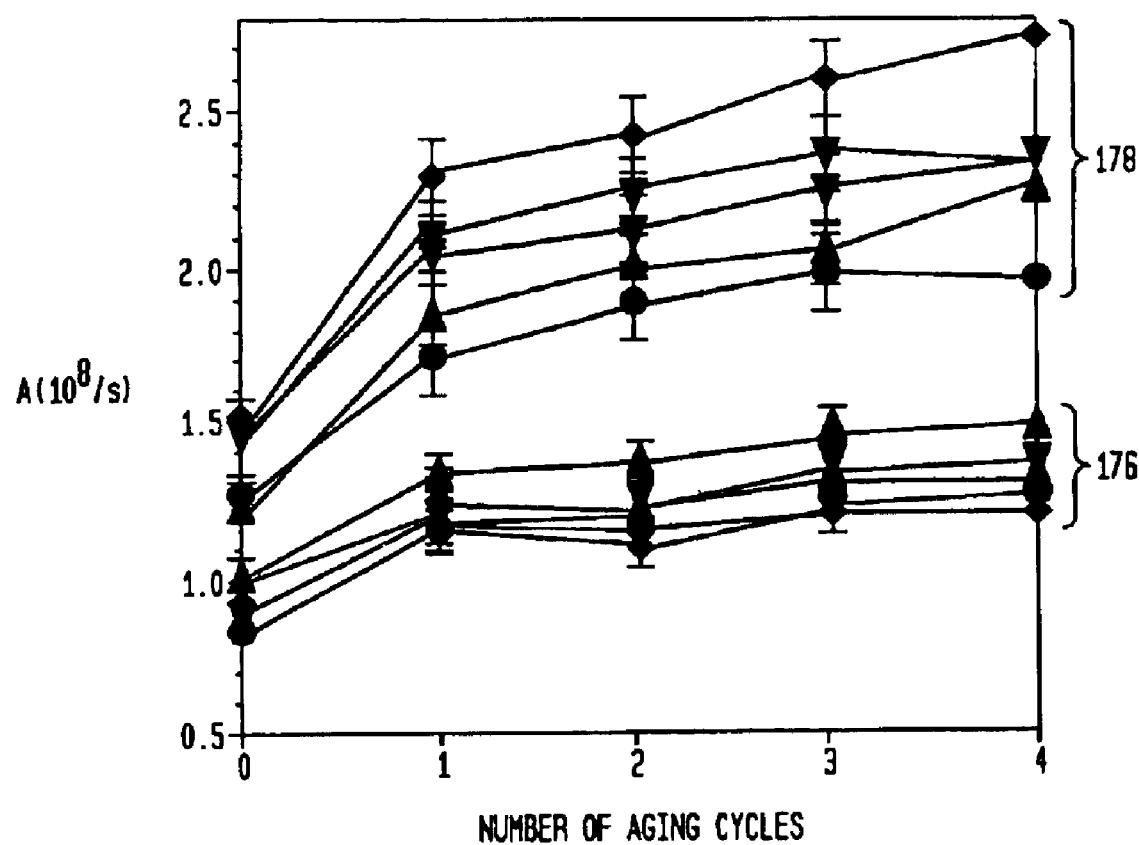
FIG. 14 shows age-induced evolution of coefficients of mono-molecular contributions to the tuning current for several DBR lasers.

FIG. 14 shows how coefficient "a" of the mono-molecular contribution to the tuning current changes over several aging cycles for ten exemplary DBR lasers 30'. Each cycle provides for accelerated aging by about 3 to 10% of the expected 25 year operating cycle of the DBR laser and was performed by operating the laser with a continuous tuning current of 150–200 ma and an operating temperature of 100–120° C. for about 24 hours. The ten DBR lasers 30' break into two groups 176, 178. In the first group 176, the coefficient "a" remains constant after about one 24-hour aging cycle. In the second group 178, the coefficient "a" continues to change as the number of aging cycles grows.

DBR lasers of the first group 176 qualify as stable against wavelength drift after a 24-hour burn-in whereas DBR lasers of the second group 178 should disqualify, because heir "a" coefficients continue to increase even after the burn in. The first and second groups 176, 178 of DBR lasers can be distinguished by at least two properties in process 160 of FIG. 13. One distinguishing property is the initial value of the coefficient "a". The initial value is less than and greater than about $1.1 \times 10^8$ per second for lasers of the first and second groups, respectively. Another distinguishing property is the value of the "a" coefficient after a burn-in period of about 3 to 10% of the expected lifetime of the lasers. For the first and second groups 176, 178, the post burn-in value of the "a" coefficient is less than and greater than about $1.5 \times 10^8$, respectively.

5. Compensating Aging Based on the Tuning Current Shift

Plotted data of FIG. 7 illustrates a linear functional relationship between $\Delta I_{tuning}$ and $\delta\lambda_{Bragg}$ for one DBR laser. The proportionality constant "$\Delta a$" relates $\delta\lambda_{Bragg}$ and $\Delta I_{tuning}$ over a range of values and is determinable from the age-induced shift to the tuning current at one laser output wavelength, i.e., one value of $\delta\lambda_{Bragg}$. Thus, measuring $\Delta I_{tuning}$ in one mode enables compensation for age-induced drift in other modes where the linear relationship holds. The linear relationship holds for modes in which heating caused by the tuning current has a negligible effect on the relationship between $I_{tuning}$ and $\delta\lambda_{Bragg}$.

Figure 15:
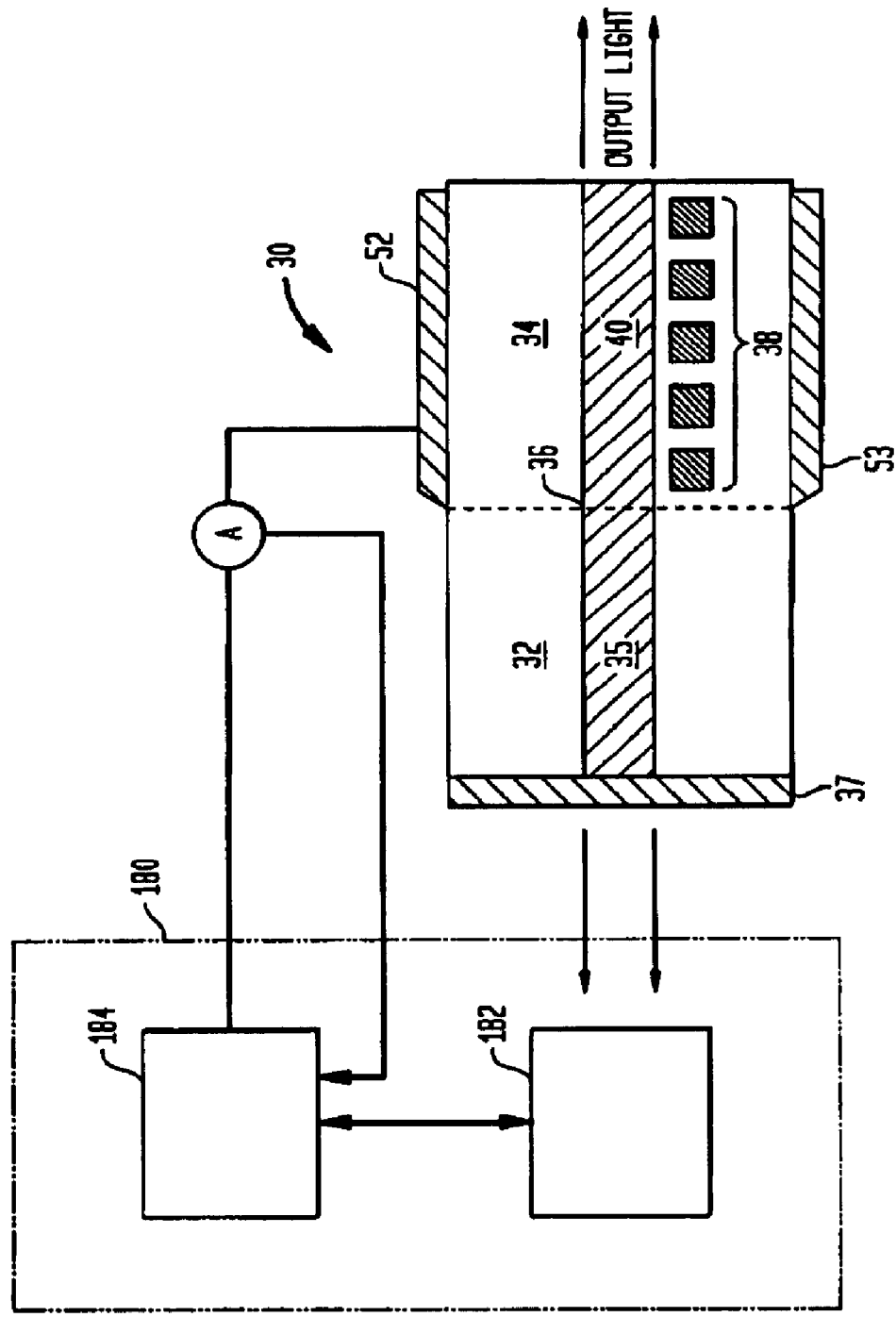
FIG. 15 shows an apparatus that compensates for age-induced wavelength drift in DBR laser 30 shown in FIG. 2.

FIG. 15 shows an apparatus 180 that compensates for age-induced wavelength drift in DBR laser 30 shown in FIG. 2. The apparatus 180 includes a closed wavelength feedback device 182 that stabilizes a single operating mode against age-induced wavelength drift. The feedback device 182 observes light leaking through back reflector 37 of the laser 30 to generate a signal indicative of changes to the operating wavelength to a controller 184. Based on the signal from the device 182, the controller 184 adjusts the tuning current applied to terminal 52 to compensate for wavelength drift in the DBR laser 30.

The controller 184 also receives a measurement of the applied value of the tuning current from ammeter 186. Based on the measurement of the tuning current, the controller 184 is able to jump to a new operating mode in a manner that compensates for aging effects on the tuning current in the new operating mode.

Figure 16:
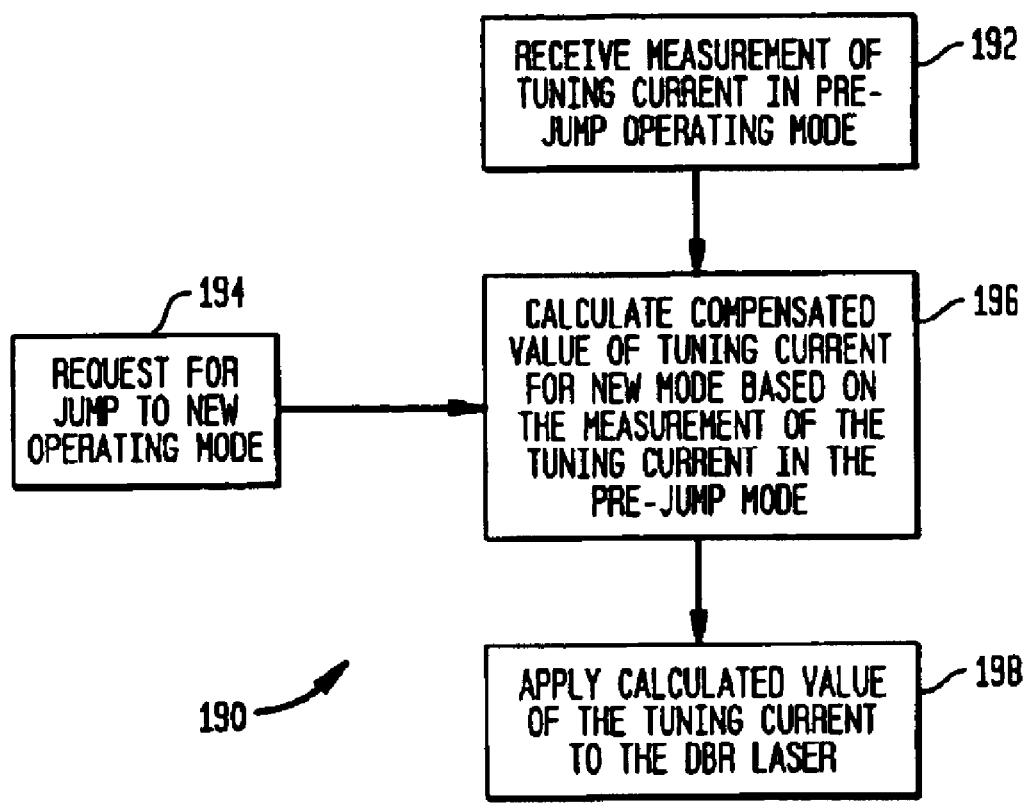
FIG. 16 is a flow chart for a process used by the apparatus of FIG. 16 to jump to new operating modes in a manner that compensates for aging.

FIG. 16 is a flow chart for a process 190 used by controller 184 of FIG. 16 to jump to new operating modes in a manner that compensates for aging. The controller 184 stores a set of initial values for tuning currents and Bragg peak wavelength shifts, $\{I_o(j), \delta\lambda_B(j)\}$. These values describe the operating modes "j" of the DBR laser 30 prior to aging. Aging does not change the associated Bragg peak wavelength shift $\delta\lambda_B(j)$.

Prior to a jump, the controller 184 receives a measured value of a tuning current, $I_p(k)$, in the pre-jump operating mode "k" from ammeter 186 (step 192). The pre-jump tuning current $I_p(k)$ may differ from the initial value of the tuning current, $I_o(k)$, for mode "k" due to aging. The controller 184 receives an external request to jump to a new operating mode "m" (step 194). In response to the request, the controller 184 calculates a compensated value of the tuning current $I_p(m)$ for the new operating mode "m" based, at least in part, on the measured value of the tuning current $I_p(k)$ in the pre-jump operating mode "k" (step 196). The controller 184 applies the calculated value of the tuning current $I_p(m)$ to electrical terminal 52 causing the DBR laser 30 to jump to the new operating mode "m" (step 198). Thus, compensation for age-induced drift in the new mode "m" is based on a measurement of the tuning current in the pre-jump operating mode "k".

To predict the tuning current, $I_p(m)$, for new mode "m", the controller 184 uses the initial $\{\delta\lambda_B(j), I_o(j)\}$ values, the measured $I_p(k)$ for the present operating mode, and the known relation between $\Delta I_{tuning}$ and $\delta\lambda_B$. From $\delta\lambda_B(k)$, $I_o(k)$, and $I_p(k)$ for the mode "k", the controller 184 calculates the coefficient, $\Delta a$, that defines age-induced changes in the relationship between $I_{tuning}$ and $\delta\lambda_B$, i.e., $\Delta a=[I_p(k)-I_o(k)]/\delta\lambda_B(k)$. Then, the controller 184 uses the same linear relationship to determine $I_p(m)$ for the new mode "m" from the initial values $\{\delta\lambda_B(m), I_o(m)\}$ and the calculated value of $\Delta a$, i.e., $I_p(m)=I_o(m)+\Delta a \, \delta\lambda_B(m)$. Thus, the determination of the age-compensated tuning current, $I_p(m)$, for the new mode only uses initial data $\{I_o(j), \delta\lambda_B(j)\}$, which is stored in the controller 184 at manufacture, and the measured tuning current $I_p(k)$ in the pre-jump operating mode "k".

Various embodiments of optical transmitters use apparatus 180 and process 190 of FIGS. 16 and 17 to control optical transmissions in multiple channels of a DWDM network in a manner that compensates for age-induced wavelength drift.

Other embodiments of the invention will be apparent to those skilled in the art from consideration of the specification, drawings, and claims.

What is claimed is:

1. A process for evaluating an aging property of a distributed Bragg reflector (DBR) laser, the DBR laser comprising a laser cavity bounded on a first end by a reflective surface and a tunable reflector portion located adjacent to a second, opposing end of the laser cavity, said tunable reflector portion including a Bragg grating that functions as a distributed reflector, the tuning supplied by a tuning current applied across said tunable reflector, the process comprising the steps of:

a) providing an initial relationship $\lambda(I)$ between the laser output wavelength $\lambda_i$ and tuning current I as applied to the tunable reflector portion;

b) placing the laser cavity in a non-lasing state;

c) illuminating the Bragg grating by an external light source;

d) applying a first tuning current to said tunable reflector portion and measuring a reflected spectrum and determining a Bragg peak wavelength $\lambda_{B,i}$ for said tuning current I;

e) repeating step d) for a plurality of tuning currents to determine a Bragg peak wavelength for each tuning current, defined as a pre-aging tuning current;

f) turning on and aging said laser cavity, then returning said laser cavity to the non-lasing state;

g) repeating step d) for the plurality of tuning currents to determine a post-aging Bragg peak wavelength $\lambda_{B,n}$ for each tuning current I;

h) calculating, for each Bragg peak wavelength $\lambda_B$, a functional relationship between a pre-aging tuning current $I_i$ and a post-aging tuning current $I_n$, where $I_n-I_i= f(\lambda_{B,n}(I_i)-\lambda_{B,i}(I_i))$;

i) selecting a laser output wavelength $\lambda_i$;

j) selecting a pre-aging tuning current I for producing the selected output laser wavelength $\lambda_i$, using the relationship provided in step a); and k) applying a post-aging tuning current $I_n$ to said tunable reflector portion associated with the pre-aging tuning current $I_i$ selected in step j), the post-aging tuning current selected using the functional relationship calculated in step h).

2. The process as defined in claim 1 wherein in performing steps b) and f), the laser is placed in a non-lasing state by reducing the reflectivity of the reflective surface disposed at the first end of the laser cavity.

3. The process as defined in claim 1 wherein in performing steps b) and f) the laser is placed in a non-lasing state by removing an input bias current from the laser cavity.

4. The process as defined in claim 1 wherein in performing step f) the laser is aged through conventional use.

5. The process as defined in claim 1 wherein in performing step f), an accelerated aging process is used.

6. The process as defined in claim 1 wherein the process is used to mark a DBR laser as disqualified using the following steps for a selected DBR laser:

l) selecting a marking tuning current;

m) determining a pre-aging Bragg peak wavelength associated with said marking tuning current;

n) determining a post-aging Bragg peak wavelength associated with said marking tuning current; and o) marking said DBR as disqualified for use if the post-aging Bragg peak wavelength has shifted more than a predetermined amount from the pre-aging Bragg peak wavelength.

7. The process as defined in claim 6 including the following step of:

p) qualifying the DBR laser as stable if the post-aging Bragg peak wavelength has not shifted more than a predetermined amount from the pre-aging Bragg peak wavelength.

8. A system for evaluating an aging property of a distributed Bragg reflector (DBR) laser, the DBR laser comprising a laser cavity bounded on a first end by a reflective surface and a tunable reflector portion located adjacent to a second, opposing end of the laser cavity, said tunable reflector portion including a Bragg grating that functions as a distributed reflector, the tuning supplied by a tuning current applied across said tunable reflector, the system comprising:

a spectrum analyzer positioned to receive light reflected by the Bragg grating of the tunable reflector portion;

an adjustable current source for applying an adjustable tuning current to said tunable reflector portion; and a processor coupled to both the laser cavity and said tunable reflector portion, said processor including program storage media configured to perform the following functions:

a) providing an initial relationship $\lambda(I)$ between the laser output wavelength $\lambda_i$ and tuning current I as applied to the tunable reflector portion;

b) placing the laser cavity in a non-lasing state;

c) illuminating the Bragg grating by an external light source;

d) applying a first tuning current to said tunable reflector portion and measuring a reflected spectrum and determining a Bragg peak wavelength $\lambda_{B,i}$ for said tuning current I;

e) repeating step d) for a plurality of tuning currents to determine a Bragg peak wavelength for each tuning current, defined as a pre-aging tuning current;

f) turning on and aging said laser cavity, then returning said laser cavity to the non-lasing state;

g) repeating step d) for the plurality of tuning currents to determine a post-aging Bragg peak wavelength $\lambda_{B,n}$ for each tuning current I;

h) calculating, for each Bragg peak wavelength $\lambda_B$, a functional relationship between a pre-aging tuning current $I_i$ and a post-aging tuning current $I_n$, where $I_n - I_i = f(\lambda_{B,n}(I_i) - \lambda_{B,i}(I_i))$;

i) selecting a laser output wavelength $\lambda_i$;

j) selecting a pre-aging tuning current for producing the selected output laser wavelength $\lambda_i$, using the relationship provided in step a); and k) applying a post-aging tuning current $I_n$ to said tunable reflector portion associated with the pre-aging tuning current $I_i$ selected in step j), the post-aging tuning current selected using the functional relationship calculated in step h).

9. The system as defined in claim 8 wherein the program storage media of the processor is used to mark a DBR laser as disqualified and further configured to perform the following steps for a selected DBR laser:

l) defining a marking tuning current;

m) determining a pre-aging Bragg peak wavelength associated with said marking tuning current;

n) determining a post-aging Bragg peak wavelength associated with said marking tuning current; and o) marking said DBR as disqualified for use if the post-aging Bragg peak wavelength has shifted more than a predetermined amount from the pre-aging Bragg peak wavelength.

10. The system as defined in claim 9 wherein the program storage media of the processor is used to qualify a DBR laser and is further configured to perform the step of comparing the post-aging Bragg peak wavelength to the pre-aging wavelength to determine if the post-aging Bragg peak wavelength has not shifted more than a predetermined amount from the pre-aging Bragg peak wavelength.

* * * * *